US012044982B2

(12) United States Patent
Matsunobu

(10) Patent No.: US 12,044,982 B2
(45) Date of Patent: Jul. 23, 2024

(54) APPARATUSES AND METHODS FOR DIFFRACTION BASE OVERLAY MEASUREMENTS

(71) Applicant: MICRON TECHNOLOGY, INC., Boise, ID (US)

(72) Inventor: Masazumi Matsunobu, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/541,079

(22) Filed: Dec. 2, 2021

(65) Prior Publication Data

US 2023/0175835 A1 Jun. 8, 2023

(51) Int. Cl.
*G03F 7/00* (2006.01)
*G01B 11/14* (2006.01)
*H01L 23/544* (2006.01)

(52) U.S. Cl.
CPC .......... *G03F 7/70633* (2013.01); *G01B 11/14* (2013.01); *G03F 7/70683* (2013.01); *H01L 23/544* (2013.01)

(58) Field of Classification Search
CPC ............ G03F 7/70633; G03F 7/70683; G01N 21/8851; G01N 21/9501; G01N 2021/95676; G01B 11/14; G01B 11/24; G01B 11/27; G01B 11/272; H01L 22/12; H01L 22/20; H01L 2223/544; H01L 23/544

See application file for complete search history.

(56) References Cited

U.S. PATENT DOCUMENTS

| | | | |
|---|---|---|---|
| 7,230,705 B1 * | 6/2007 | Yang | H01L 21/681 257/797 |
| 7,508,976 B1 * | 3/2009 | Yang | G03F 7/70633 382/151 |
| 7,616,313 B2 * | 11/2009 | Kandel | G03F 7/70633 356/401 |
| 8,034,515 B2 * | 10/2011 | Ishigo | G03F 7/70633 430/394 |
| 9,709,903 B2 * | 7/2017 | Choi | G03F 7/70633 |
| 10,042,268 B2 * | 8/2018 | Smilde | G03F 7/70633 |
| 10,289,008 B2 * | 5/2019 | Jak | G01N 21/9505 |
| 10,451,412 B2 * | 10/2019 | Adel | G01N 21/9501 |
| 10,453,758 B2 * | 10/2019 | Van Leest | G01N 21/9501 |
| 10,527,952 B2 * | 1/2020 | Grunzweig | G03F 7/70683 |

(Continued)

*Primary Examiner* — Gordon J Stock, Jr.
(74) *Attorney, Agent, or Firm* — Dorsey & Whitney LLP

(57) ABSTRACT

Apparatuses and methods of overlay measurement are disclosed. An example apparatus includes first and second layers. The first layer includes a first alignment pattern that includes a first line extending in a first direction. The first line includes first, second and third segments. The second layer above the first layer includes a second alignment pattern including: a second line extending in the first direction above the first segment and having a first offset from the first segment in a second direction perpendicular to the first direction; a third line extending in the first direction above the second segment and having a second offset from the second segment in the second direction; and a fourth line extending in the first direction above the third segment and having a third offset from the third segment in the second direction. The first, second and third offsets are different from one another.

21 Claims, 5 Drawing Sheets

FIG. 2B

(56) References Cited

U.S. PATENT DOCUMENTS

| | | | |
|---|---|---|---|
| 10,656,537 B2* | 5/2020 | Solowan | G03F 9/7011 |
| 10,824,082 B2* | 11/2020 | Feler | G03F 7/706 |
| 11,460,783 B2* | 10/2022 | Gronheid | G03F 7/70625 |
| 11,822,254 B2* | 11/2023 | Den Boef | G01N 21/47 |
| 2016/0334208 A1* | 11/2016 | Liou | G03F 7/70633 |
| 2016/0334716 A1* | 11/2016 | Mieher | G03F 1/44 |
| 2018/0188663 A1* | 7/2018 | Levinski | G03F 7/70633 |
| 2018/0364179 A1* | 12/2018 | Gready | G01N 21/95607 |
| 2019/0101835 A1* | 4/2019 | Chen | G03F 7/70683 |
| 2019/0252270 A1* | 8/2019 | Hoo | G03F 7/70616 |
| 2021/0233821 A1* | 7/2021 | Feler | H01L 22/30 |
| 2023/0114601 A1* | 4/2023 | Schmidt | G03F 7/70633 |
| | | | 438/5 |

\* cited by examiner

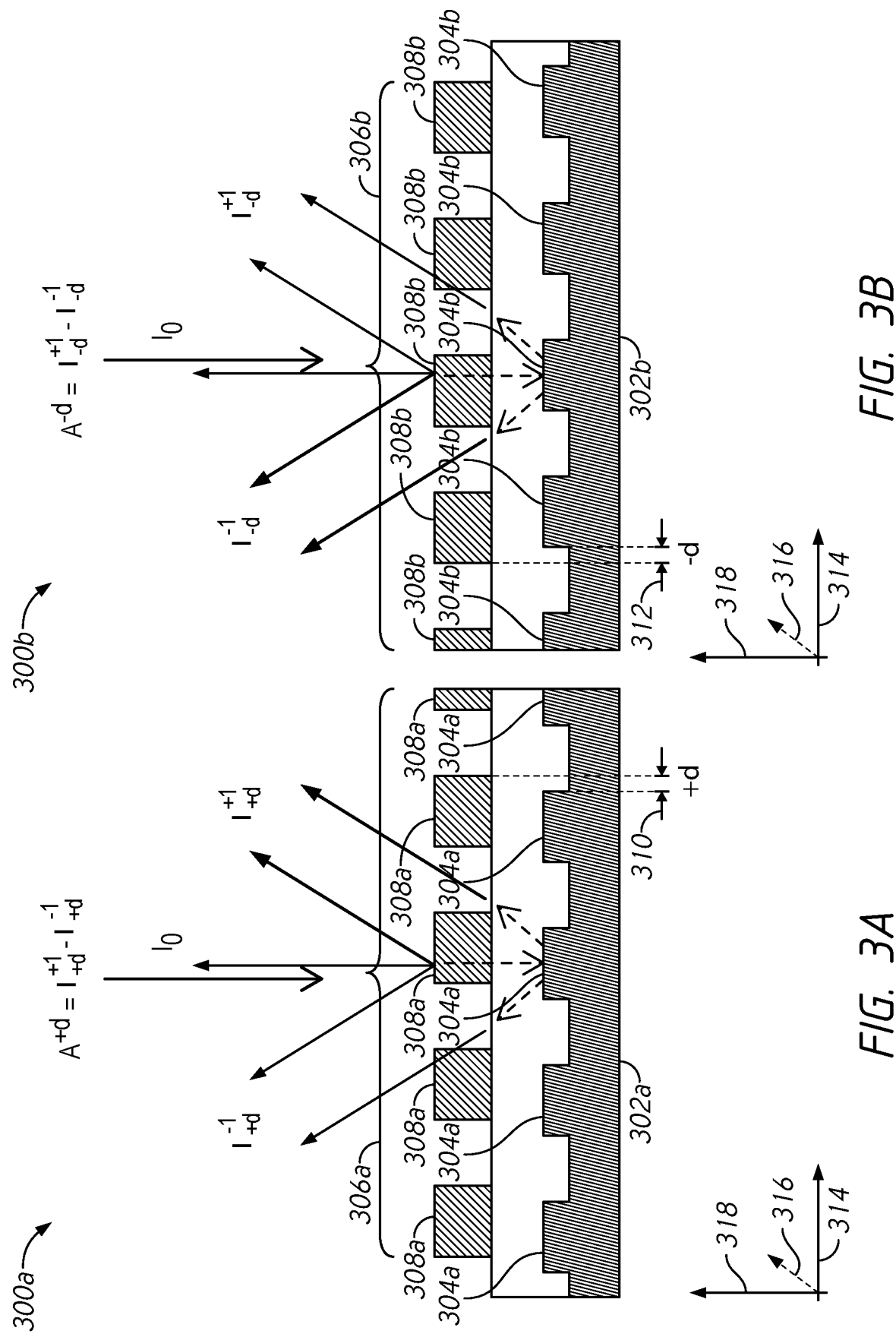

APPARATUSES AND METHODS FOR DIFFRACTION BASE OVERLAY MEASUREMENTS

BACKGROUND

High data reliability, high speed of memory access, lower power consumption and reduced chip size are features that are demanded from semiconductor memory. Recently in semiconductor memory devices such as dynamic random access memories (DRAMs), static RAMs (SRAMs), flash memories, increased memory capacity and high data reliability with reduced chip size, precision of patterning across layers has been demanded.

In order to measure pattern precision, a diffraction-based overlay (DBO) metrology technique has been used. In the DBO metrology technique, a light may be irradiated from above a semiconductor device including a plurality of layers having similar patterns in an alignment pattern region. Asymmetry of intensities of diffraction of light from the plurality of layers is obtained. Based on asymmetries obtained from a plurality of sites of the semiconductor device, overlays across the patterns of the plurality of layers are computed. Using the DBO metrology technique, accuracy of patterns across layers may be verified and circuit pattern robustness may be improved. However, accuracy of the DBO metrology may be subject to noises in patterns in each layer. Thus, to reduce noise and improve measurements, more effective sampling of asymmetry data in the DBO metrology technique may be desired.

BRIEF DESCRIPTION OF THE DRAWINGS

FIG. 3A is a schematic diagram of a portion of a target in a semiconductor device.

FIG. 3B is a schematic diagram of another portion of the target in the semiconductor device.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

A semiconductor device may include a pair of alignment patterns including an upper alignment pattern and a lower alignment pattern in an alignment pattern region. The upper alignment pattern may include a plurality of lines having a plurality of respective offsets from a plurality of corresponding segments in a line of the lower alignment pattern. By including the plurality of respective offsets, more overlay samples may be measured in a single image capturing diffractions from the pair of alignment patterns. Thus, greater accuracy and improved robustness in estimating an overlay may be achieved with less process steps and cost.

Figures 1A, 1B:
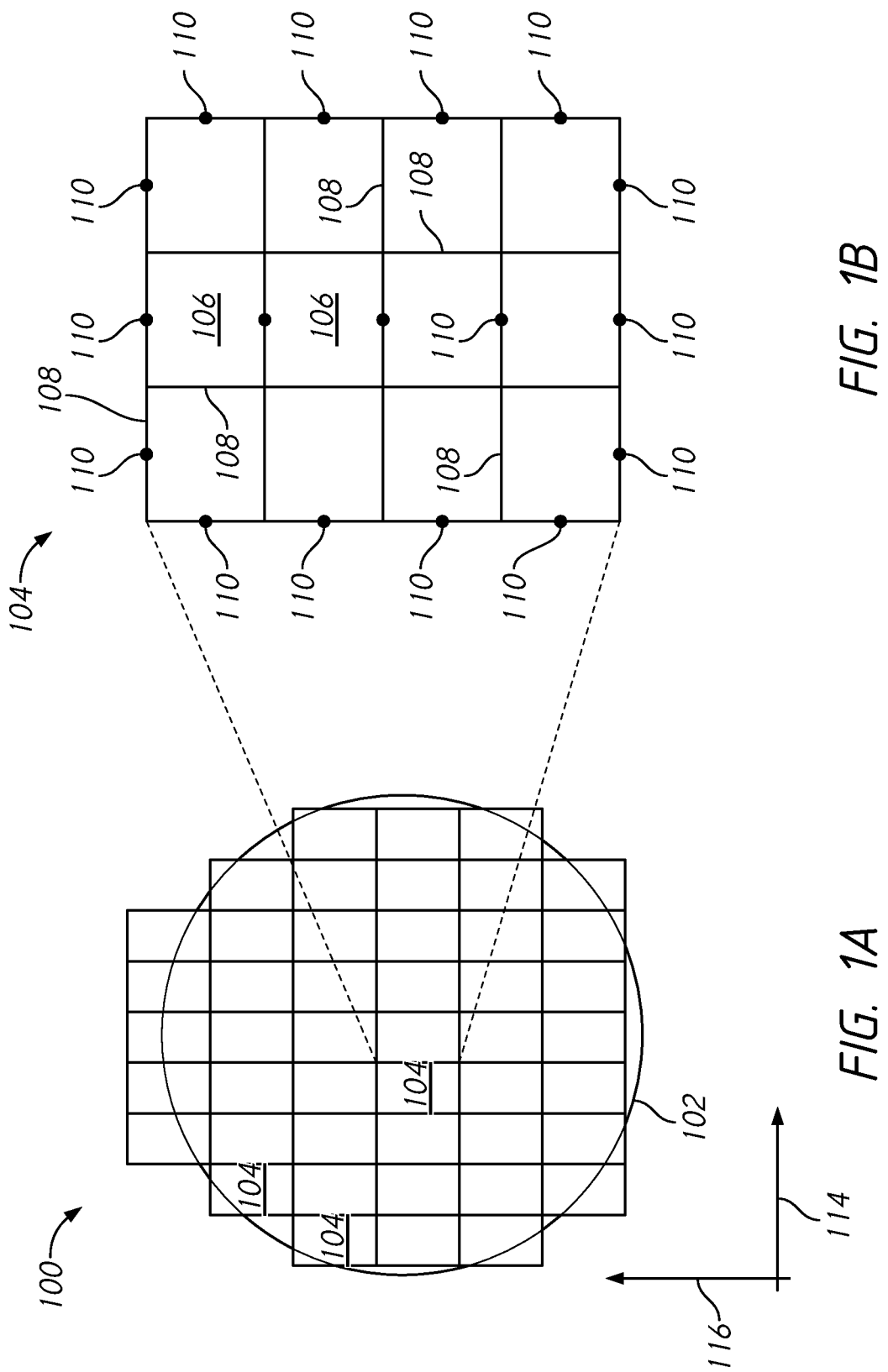
FIG. 1A is a diagram for a layout of a semiconductor device in accordance with an embodiment of the present disclosure.
FIG. 1B is a schematic diagram for a layout of a pattern region in accordance with an embodiment of the present disclosure.

FIG. 1A is a diagram for a layout of a semiconductor device 100 in accordance with an embodiment of the present disclosure. FIG. 1A is a plan view illustrating a schematic configuration of a layout of pattern regions 104 formed on a substrate 102. In some embodiments, the substrate 102 is a wafer. In some embodiments, the substrate 102 may include silicon (Si). The semiconductor device 100 in FIG. 1A may be in a state before the semiconductor device 100 is separated into semiconductor chips. The semiconductor device 100 may be manufactured using photo patterning by applying a reticle on each pattern region 104. The reticle (not shown) including a pattern image that is transferred to a layer that functions as a mask on each pattern region 104. The reticle may be stepped and repeated in one direction 114 and then to another direction 116 to substantially cover the substrate 102. In some embodiments, the pattern regions 104 may be disposed in a matrix and each pattern region 104 may have a rectangular shape. Thus, all pattern regions 104 on the substrate 102 which do not include a portion beyond the substrate 102 may include a similar pattern according to the pattern image.

FIG. 1B is a schematic diagram for a layout of a pattern region 104 in accordance with an embodiment of the present disclosure. The pattern region 104 may include circuit regions 106 disposed in a matrix. Each circuit region 106 may have a rectangular shape. In each circuit region 106, transistors and circuit components, such as conductive interconnects may be disposed. For example, the transistors and the circuit components may include a plurality of memory cells, one or more circuits that provide memory access functions, such as read operations and write operations to the memory cells, and control circuits that control operation of the various circuit components. The semiconductor device 100 is separated into semiconductor chips by cutting the semiconductor device 100 along scribe lines 108 during a dicing step. After the semiconductor device 100 is separated, each semiconductor chip may be referred to as a die. The scribe lines 108 are disposed around each circuit region 106. Each scribe line 108 may be disposed between adjacent circuit regions 106 or on an edge of the pattern region 104. In some embodiments, each scribe line 108 may include one or more alignment pattern regions 110.

Figures 2A, 2B:
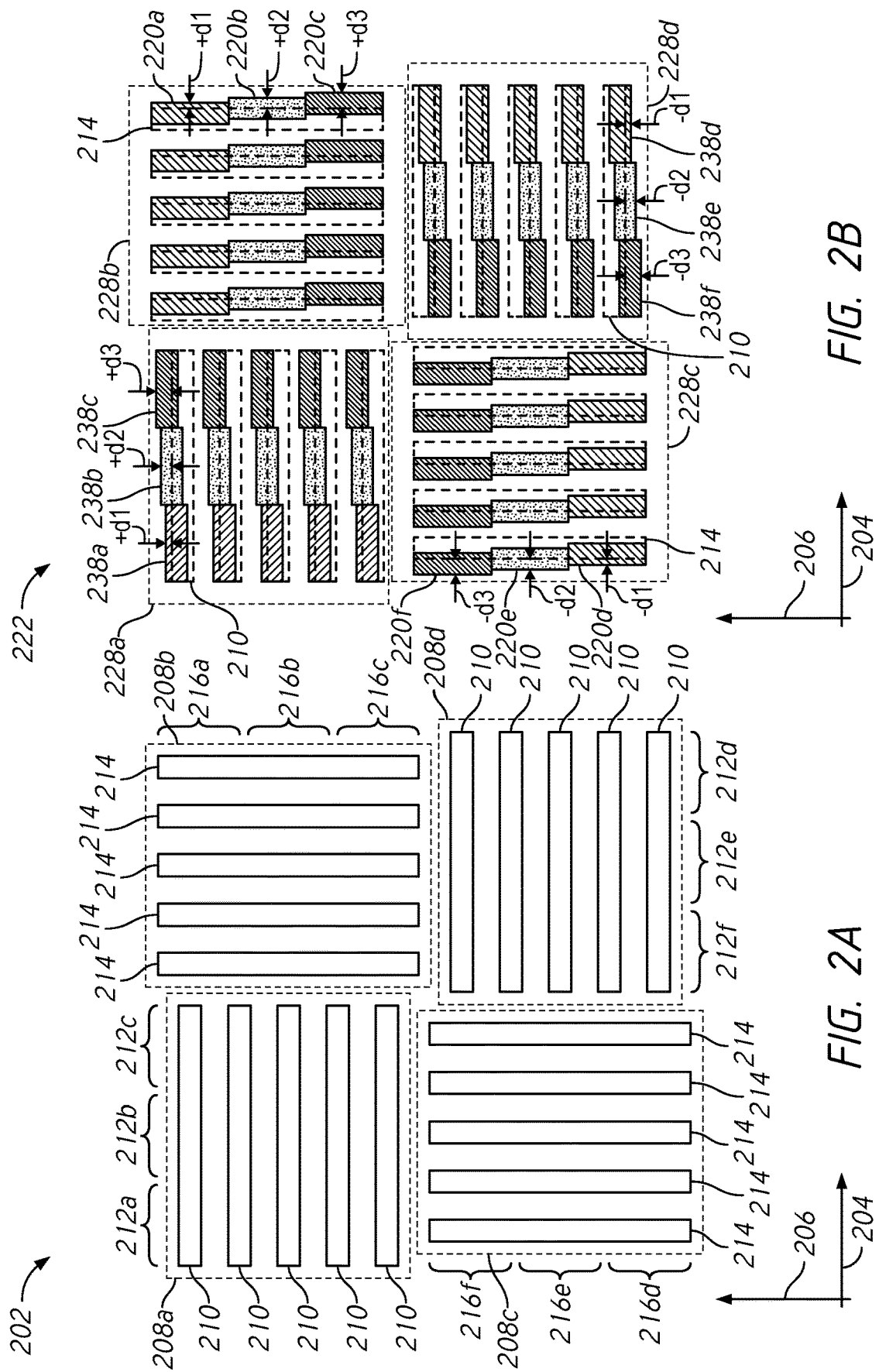
FIG. 2A is a diagram for a layout of an alignment pattern in a semiconductor device in accordance with an embodiment of the present disclosure.
FIG. 2B is a diagram for a layout of an alignment pattern in the semiconductor device in accordance with the embodiment of the present disclosure.

FIG. 2A is a diagram for a layout of an alignment pattern 202 in a semiconductor device 100 and FIG. 2B is a plan view illustrating a schematic configuration of a layout of the alignment pattern 222 in accordance with an embodiment of the present disclosure. The alignment pattern 202 may be included in a layer and formed during the masking and processing of that layer. In some embodiments, the layer may include bit line contacts (not shown) in the circuit regions 106 of FIG. 1. In some embodiments, the layer may be formed as an upper portion of the substrate 102 of the semiconductor device 100. The alignment pattern 202 may be arranged in a plurality of sites 208a-208d. In some embodiments, sites of the plurality of sites 208a-208d that are diagonal to each other may include similar gratings. For example, the sites 208a and 208d are diagonal to each other in the alignment pattern 202 and include a plurality of lines 210 extending in a direction 204 in parallel. In some embodiments, widths of the plurality of lines 210 may be constant and spaces between adjacent lines 210 may be constant. In some embodiments, each line 210 of the plurality of lines 210 may include a plurality of segments extending in the direction 204. For example, each line 210 may include segments 212a, 212b and 212c.

The sites 208b and 208c may be disposed diagonal to each other in the alignment pattern 202. The site 208b may be adjacent to the site 208a in the direction 204 and also adjacent to the site 208d in a direction 206 perpendicular to the direction 204. The site 208c may be adjacent to the site 208a in a direction opposite to the direction 206 and also adjacent to the site 208d in a direction opposite to the direction 204. The sites 208b and 208c may include a plurality of lines 214 extending in the direction 206 in parallel. In some embodiments, widths of the plurality of lines 214 may be constant and spaces between adjacent lines 214 may be constant. In some embodiments, each line 214 of the plurality of lines 214 may include a plurality of segments extending in the direction 206. For example, each line 214 may include segments 216a, 216b and 216c.

FIG. 2B is a diagram for a layout of an alignment pattern 222 in the semiconductor device 100 in accordance with the embodiment of the present disclosure. FIG. 2B is a plan view illustrating a schematic configuration of a layout of the alignment pattern 222. A layer including the alignment pattern 222 may be formed above the layer including the alignment pattern 202. For example, the alignment pattern 222 may be above the substrate 102 of the semiconductor device 100. In some embodiments, the alignment pattern 222 may be disposed in the same layer as bit lines in the circuit regions 106 of the semiconductor device 100. In some embodiments, the alignment pattern 222 may be disposed in the same layer as word lines in the circuit regions 106 of the semiconductor device 100.

The alignment pattern 222 may be arranged in a plurality of sites 228a-228d disposed above the plurality of sites 208a-208d. In some embodiments, sites of the plurality of sites 228a-228d that are diagonal to each other may include similar gratings. The sites 228a and 228d may be disposed diagonal to each other in the alignment pattern 222.

The site 228a may include a plurality of combination of lines 238a, 238b and 238c extending in the direction 204. In some embodiments, widths of the lines 238a, 238b, and 238c may be constant and spaces between adjacent lines 238a, 238b or 238c may be constant. In some embodiments, the lines 238a may be adjacent to one end of the lines 238b and the lines 238c may be adjacent to the another end of the lines 238b. In some embodiments, each line 238a of the lines 238a may be disposed above a corresponding segment 212a of the segments 212a of the alignment pattern 202, and having an offset +d1 from the corresponding segment 212a in the direction 206. Similarly, each line 238b of the lines 238b may be disposed above a corresponding segment 212b of the segments 212b of the alignment pattern 202, and having an offset +d2 from the corresponding segment 212b in the direction 206. Each line 238c of the lines 238c may be disposed above a corresponding 212c of the segments 212c of the alignment pattern 202, and having an offset +d3 from the corresponding segment 212c in the direction 206. In some embodiments, the offset +d2 may be greater than the offset +d1, and the offset +d3 may be greater than the offset +d2 (+d3 >+d2 >+d1).

The site 228d may include a plurality of combination of lines 238d, 238e and 238f extending in the direction 204. In some embodiments, widths of the lines 238d, 238e and 238f may be constant and spaces between adjacent lines 238d, 238e or 238f may be constant. In some embodiments, the lines 238d may be adjacent to one end of the lines 238e and the lines 238f may be adjacent to another end of the lines 238e. In some embodiments, each line 238d of the lines 238d may be disposed above a corresponding segment 212d of the segments 212d of the alignment pattern 202, and having an offset −d1 from the corresponding segment 212d in the direction 206. The offset −d1 is the same size of the offset +d1 from each segment 212d in a direction opposite to the direction 206. Similarly, each line 238e of the lines 238e may be disposed above a corresponding segment 212e of the segments 212e of the alignment pattern 202, and having an offset −d2 from the corresponding segment 212e in the direction 206. The offset −d2 is the same size of the offset +d2 from each segment 212e in a direction opposite to the direction 206. Each line 238f of the lines 238f may be disposed above a corresponding segment 212f of the segments 212f of the alignment pattern 202, and having an offset −d3 from the corresponding segment 212f in the direction 206. The offset −d3 is the same size of the offset +d3 from each segment 212f in a direction opposite to the direction 206. In some embodiments, the offset −d2 may be greater than the offset −d3, and the offset −d1 may be greater than the offset −d2 (−d3<−d2<−d1).

The sites 228b and 228c may be disposed diagonal to each other in the alignment pattern 222. The site 228b may include a plurality of combination of lines 220a, 220b and 220c extending in the direction 206. In some embodiments, widths of the lines 220a, 220b and 220c may be constant and spaces between adjacent lines 220a, 220b and 220c may be constant. In some embodiments, the lines 220a may be adjacent to one end of the lines 220b and the lines 238c may be adjacent to another end of the lines 220b. In some embodiments, each line 220a of the lines 220a may be disposed above a corresponding segment 216a of the segments 216a of the alignment pattern 202, and having an offset +d1 from the corresponding segment 216a in the direction 204. Similarly, each line 220b of the lines 220b may be disposed above the corresponding segment 216b of the segments 216b of the alignment pattern 202, and having an offset +d2 from the corresponding segment 216b in the direction 204, and each line 220c of the lines 220c may be disposed above the corresponding segment 216c of the segments 216c of the alignment pattern 202, and having an offset +d3 from the corresponding segment 216c in the direction 204.

The site 228c may include a plurality of combination of lines 220d, 220e and 220f extending in the direction 206. In some embodiments, widths of the lines 220d, 220e and 220f may be constant and spaces between adjacent lines 220d, 220e and 220f may be constant. In some embodiments, the lines 220d may be adjacent to one end of the lines 220e and the lines 220f may be adjacent to another end of the lines 220e. In some embodiments, each line 220d of the lines 220d may be disposed above the corresponding segment 216d of the segments 216d of the alignment pattern 202, and having an offset −d1 from the corresponding segment 216d in the direction 204, having the same size of the offset +d1 in a direction opposite to the direction 204. Similarly, each line 220e of the lines 220e may be disposed above the corresponding segment 216e of the segments 216e of the alignment pattern 202, and having an offset −d2 from the corresponding segment 216e in the direction 204, and each line 220f of the lines 220f may be disposed above the corresponding segment 216f of the segments 216f of the alignment pattern 202, having an offset −d3 from the corresponding segment 216f in the direction 204.

An overlay may be calculated by diffraction of incident light on a target including a pair of alignment patterns including a lower alignment pattern and an upper alignment pattern above the lower alignment pattern. FIG. 3A is a cross-sectional view illustrating a schematic configuration of a portion 300a of a target in a semiconductor device. The portion 300a may include a portion 302a of a lower alignment pattern and a portion 306a of an upper alignment pattern. In some embodiment, the portion 302a may be included in the alignment pattern 202 in FIG. 2A. In some embodiments, the portion 302a may be an upper portion of the substrate 102 in the alignment pattern region 110 of FIG. 1. The portion 302a may include segments 304a arranged in a direction 314. In some embodiments, the segments 304a may be provided by removing portions of the substrate 102 between the segments 304a. The segments 304a may extend in parallel in a direction 316 perpendicular to the direction 314. In some embodiments, each segment 304a may be a portion of a plurality of lines 210 in the site 208a, or a portion of a plurality of lines 214 in the site 208b. In some embodiments, the segments 304a may be any of the segments 212a, the segments 212b, the segments 212c, the segments 216a, the segments 216b or the segments 216c. In some embodiments, the portion 306a may be included in the alignment pattern 222 in FIG. 2B.

In some embodiments, the portion 306a may be disposed above the portion 302a. The portion 306a may include lines 308a arranged in the direction 314. The lines 308a may extend in parallel in the direction 316. In some embodiments, the lines 308a may be any of the lines 238a, the lines 238b or the lines 238c in the site 228a or the lines 240a, the lines 240b, or the lines 240c in the site 228b. Each line 308a of the lines 308a may have a positive offset +d from each respective segment 304a of the segments 304a immediately below. In some embodiments, the portion 306a may be formed as a photoresist by depositing polyimide or phenolic resin. The lines 308a may be provided by removing portions of the photoresist between the lines 308a.

The portion 300a may be illuminated with incident light Io from a direction 318 perpendicular to the directions 314 and 316. In some embodiments, the lines 308a may transmit a portion of the incident light Io. Light diffracted from the alignment patterns interfere and intensities of light interference are captured in an image. An overlay is then computed from an intensity asymmetry of the alignment patterns including the portions 302a and 306a. The alignment patterns may provide intensities of diffractions $I_{+d}^{-1}$ and $I_{+d}^{+1}$ that are observed in a positive and negative direction along the direction 314. When the alignment pattern including the portion 306a is misaligned by an offset 310 (+d) with the alignment pattern including the portion 302a, there will be an asymmetry in the diffractions where the intensity of diffraction $I_{+d}^{+1}$ is stronger than the intensity of $I_{+d}^{-1}$. An asymmetry $A^{+d}$ may be computed as a difference between the intensities of diffractions $I_{+d}^{+1}$ and $I_{+d}^{-1}$ as expressed by an equation (1) below.

$$A^{+d} = I_{+d}^{+1} - I_{+d}^{-1} \quad (1)$$

FIG. 3B is a cross-sectional view illustrating a schematic configuration of a portion 300b of a target in the semiconductor device. The portion 300b may include a portion 302b of the alignment pattern and a portion 306b of the alignment pattern. In some embodiment, the portion 302b may be included in the alignment pattern 202 in FIG. 2A. In some embodiments, the portion 302b may be a portion of the substrate 102 in alignment pattern region 110 of FIG. 1. The portion 302b may include segments 304b arranged in the direction 314. In some embodiments, the segments 304b may be provided by removing portions of the substrate 102 between the segments 304b. The segments 304b may extend in parallel in the direction 316. In some embodiments, each segment 304b may be a portion of a plurality of lines 210 in the site 208d, or a portion of a plurality of lines 214 in the site 208c. In some embodiments, the segments 304b may be any of the segments 212d, the segments 212e, the segments 212f, the segments 216d, the segments 216e or the segments 216f. In some embodiments, the portion 306b may be included in the alignment pattern 222 in FIG. 2B.

In some embodiments, the portion 306b may be disposed above the portion 302b. The portion 306b may include lines 308b arranged in the direction 314. The lines 308b may extend in parallel in the direction 316. In some embodiments, the lines 308b may be any of the lines 238d, the lines 238e or the lines 238f in the site 228d or the lines 240d, the lines 240e, or the lines 240f in the site 228c. Each line 308b of the lines 308b may have a negative offset 312 (−d) from each respective segment 304b of the segments 304b immediately below. In some embodiments, the portion 306b may be formed as a photoresist by depositing polyimide or phenolic resin. The lines 308b may be provided by removing portions of the photoresist between the lines 308b.

The portion 300b may be illuminated with incident light Io from the direction 318. In some embodiments, the lines 308b may transmit a portion of the incident light Io. Light diffracted from the alignment patterns interfere and intensities of light interference is captured in an image. An overlay is then computed from an intensity asymmetry of the alignment patterns including the portions 302b and 306b. The alignment patterns may provide intensities of diffractions $I_{-d}^{-1}$ and $I_{-d}^{+1}$ that are observed in a positive and negative direction along the direction 314. When the alignment pattern including the portion 306b is misaligned by an offset +d with the alignment pattern including the portion 302b, there will be an asymmetry in the diffractions where the intensity of diffraction $I_{-d}^{-1}$ is stronger than the intensity of $I_{-d}^{+1}$. An asymmetry $A^{-d}$ is computed as a difference between intensities of diffractions $I_{-d}^{+1}$ and $I_{-d}^{-1}$ as expressed by an equation (2) below.

$$A^{-d} = I_{-d}^{+1} - I_{-d}^{-1} \quad (2)$$

Based on asymmetries $A^{+d}$ and $A^{-d}$ obtained by the equations (1) and (2), a measured overlay OLm may be approximated by an equation (3) below.

$$OLm = \frac{+d - (-d)}{2} \left( \frac{A^{+d} + A^{-d}}{A^{+d} - A^{-d}} \right) \quad (3)$$

Thus, the measured overlay OL may be computed by measuring diffraction intensities in each site of the alignment pattern region 110.

Figure 4:
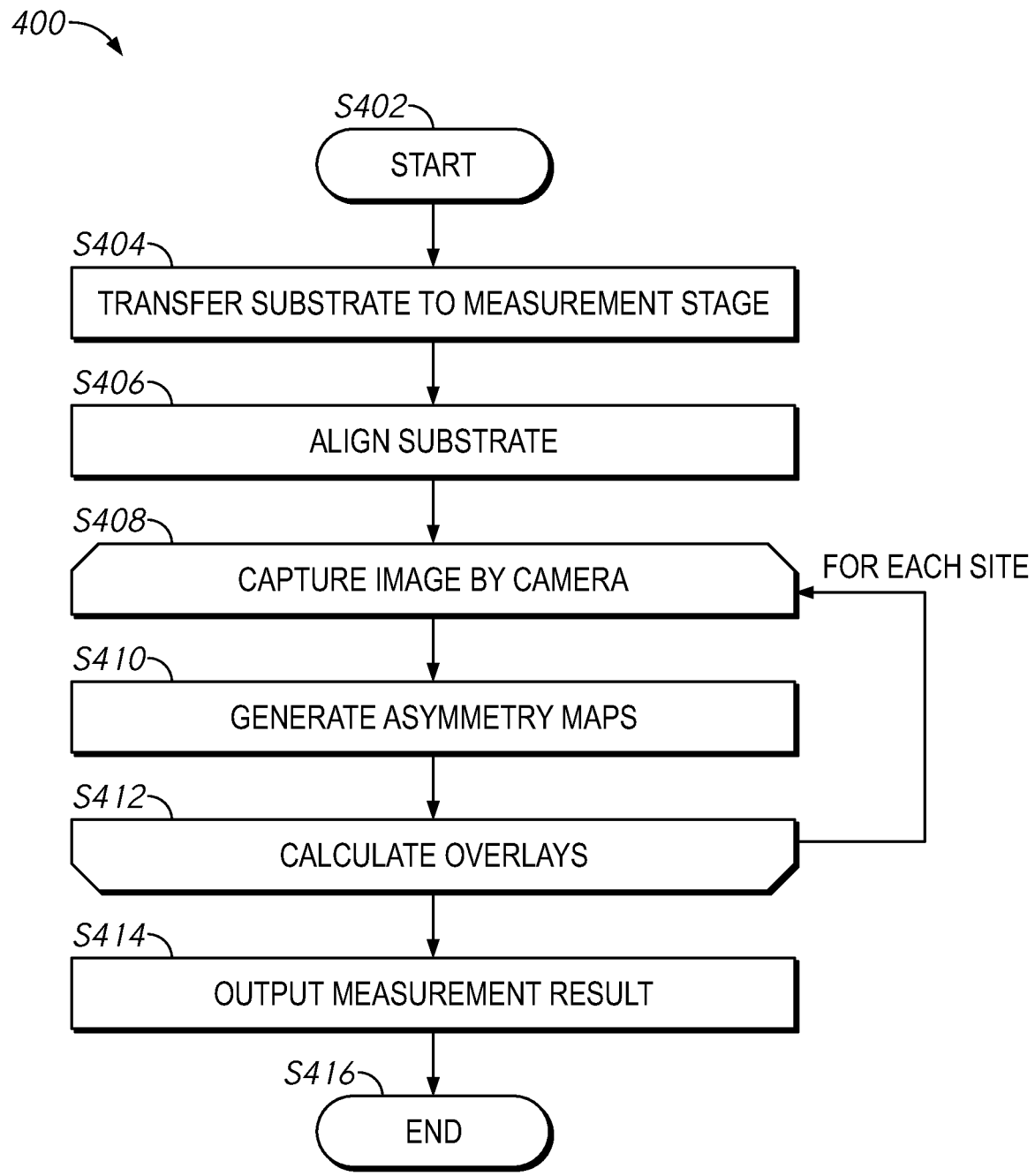
FIG. 4 is a flow diagram performing overlay measurement of an alignment pattern region of the semiconductor device in accordance with an embodiment of the present disclosure.

Applying the equations (1)-(3) to the alignment pattern region 110 including the alignment patterns 202 and 222, a plurality of overlays in the alignment pattern region 110 may be computed. FIG. 4 is a flow diagram 400 performing overlay measurement of the alignment pattern region 110 of the semiconductor device 100 in accordance with an embodiment of the present disclosure. The overlay measurement may be performed when a pattern image has been transferred to a mask layer in order to determine alignment accuracy of the alignment pattern image of the mask layer relative to existing alignment patterns of the semiconductor device. Once the overlay measurement starts (step S402), the substrate 102 of the semiconductor device 100 may be transferred to a measurement stage (step S404). The substrate 102 may be aligned on the stage (step S406) for image capturing. The substrate 102 includes the alignment pattern 202 and the alignment pattern 222 above the alignment pattern 202 in the alignment pattern region 110.

The alignment pattern region 110 may be illuminated with incident light from a third direction perpendicular to the directions 204 and 206 in FIGS. 2A and 2B. Light diffracted from the alignment patterns 202 and 222 interfere, and intensities of light interference are captured resulting in an image by a camera (step S408). For example, in some embodiments, a combination of the segments 212a and the lines 238a, a combination of the segments 212b and the lines 238b, and a combination of the segments 212c and the lines 238c in the site 208a may receive a light from a direction perpendicular to the directions 204 and 206, and provide diffracted light. The diffracted light may have different intensities $I_{+d1}^{-1}$ and $I_{+d1}^{+1}$, $I_{+d2}^{-1}$ and $I_{+d2}^{+1}$, $I_{+d3}^{-1}$ and $I_{+d}^{+1}$ from one another in the direction 206 and its opposite direction, respectively. In some embodiments, a combination of the segments 216a and the lines 220a, a combination of the segments 216b and the lines 220b, and a combination of the segments 216c and the lines 220c in the site 208b may receive a light from the direction perpendicular to the directions 204 and 206, and provide diffracted light. The diffracted light may have different intensities $I_{+d1}^{-1}$ and $I_{+d1}^{+1}$, $I_{+d2}^{-1}$ and $I_{+d2}^{+1}$, $I_{+d3}^{-1}$ and $I_{+d}^{+1}$ from one another in the direction 204 and its opposite direction, respectively. In some embodiments, a combination of the segments 212d and the lines 238d, a combination of the segments 212e and the lines 238e, and a combination of the segments 212f and the lines 238f in the site 208d may receive a light from the direction perpendicular to the directions 204 and 206, and provide diffracted light. The diffracted light may have different intensities and $I_{+d1}^{-1}$ and $I_{+d1}^{+1}$, $I_{+d2}^{-1}$ and $I_{+d2}^{+1}$, $I_{+d3}^{-1}$ and $I_{+d}^{+1}$ from one another in the direction 206 and its opposite direction, respectively. In some embodiments, a combination of the segments 216d and the lines 220d, a combination of the segments 216e and the lines 220e, and a combination of the segments 216f and the lines 220f in the site 208c may receive a light from the direction perpendicular to the directions 204 and 206, and provide diffracted lights. The diffracted light may have having different intensities $I_{+d1}^{-1}$ and $I_{-d1}^{+1}$, $I_{-d2}^{-1}$ and $I_{-d2}^{+1}$, $I_{-d3}^{-1}$ and $I_{-d}^{+1}$ from one another in the direction 204 and its opposite direction, respectively.

An asymmetry map is generated (step S410) by applying a plurality of offsets in each site of the sites 208a-208d to the equations (1)-(2). In order to calculate the asymmetry map, intensities of diffraction for a plurality of positive offsets and a plurality of negative offsets are obtained. In some embodiments, intensities $I_{+d1}^{-1}$ and $I_{+d1}^{+1}$ for the offset +d1, intensities $I_{+d2}^{-1}$ and $I_{+d2}^{+1}$ for the offset +d2, intensities $I_{+d3}^{-1}$ and $I_{+d3}^{+1}$, for the offset +d3 may be obtained in each of directions 204 and 206 for the sites 208a and 208b respectively from the image captured by the camera in step S408. In some embodiments, intensities $I_{-d1}^{-1}$ and $I_{-d1}^{+1}$ for the offset −d1, intensities $I_{-d2}^{-1}$ and $I_{-d2}^{+1}$ for the offset −d2, intensities $I_{-d3}^{-1}$ and $I_{-d3}^{+1}$ for the offset −d3 may be obtained in each of directions 204 and 206 for the sites 208c and 208d respectively from the image captured by the camera in step S408.

For each of the positive offsets, an asymmetry is obtained by applying the corresponding intensities to the equation (1). For each of the negative offsets, an asymmetry is obtained by applying the corresponding intensities to the equation (2). Thus, asymmetries corresponding to the sites 208a-208d, each including three offsets (e.g., a combination of $A^{+d1}$, $A^{+d2}$ and $A^{+d3}$ or a combination of $A^{-d1}$, $A^{-d2}$ and $A^{-d3}$) may be obtained.

Following the generation asymmetry map, measured overlays are calculated (step S412) using the asymmetry maps obtained in step S410. Applying a plurality of combination of an asymmetry (one of $A^{+d1}$, $A^{+d2}$, $A^{+d3}$) of one of the positive offsets (+d1, +d2, +d3) and an asymmetry (one of $A^{-d1}$, $A^{-d2}$ and $A^{-d3}$) of one of the negative offsets (−d1, d2, −d3) into the above equation (3), a plurality of combinations of design offset and corresponding measured overlay can be computed as shown in Table 1 below.

TABLE 1

| Design Offset | Measured Overlay |
|---|---|
| $\dfrac{+d1 - (-d1)}{2}$ | $\dfrac{+d1 - (-d1)}{2}\left(\dfrac{A^{+d1} + A^{-d1}}{A^{+d1} - A^{-d1}}\right)$ |
| $\dfrac{+d1 - (-d2)}{2}$ | $\dfrac{+d1 - (-d2)}{2}\left(\dfrac{A^{+d1} + A^{-d2}}{A^{+d1} - A^{-d2}}\right)$ |
| $\dfrac{+d1 - (-d3)}{2}$ | $\dfrac{+d1 - (-d3)}{2}\left(\dfrac{A^{+d1} + A^{-d3}}{A^{+d1} - A^{-d3}}\right)$ |
| $\dfrac{+d2 - (-d1)}{2}$ | $\dfrac{+d2 - (-d1)}{2}\left(\dfrac{A^{+d2} + A^{-d1}}{A^{+d2} - A^{-d1}}\right)$ |
| $\dfrac{+d2 - (-d2)}{2}$ | $\dfrac{+d2 - (-d2)}{2}\left(\dfrac{A^{+d2} + A^{-d2}}{A^{+d2} - A^{-d2}}\right)$ |
| $\dfrac{+d2 - (-d3)}{2}$ | $\dfrac{+d2 - (-d3)}{2}\left(\dfrac{A^{+d2} + A^{-d3}}{A^{+d2} - A^{-d3}}\right)$ |
| $\dfrac{+d3 - (-d1)}{2}$ | $\dfrac{+d3 - (-d1)}{2}\left(\dfrac{A^{+d3} + A^{-d1}}{A^{+d3} - A^{-d1}}\right)$ |
| $\dfrac{+d3 - (-d2)}{2}$ | $\dfrac{+d3 - (-d2)}{2}\left(\dfrac{A^{+d3} + A^{-d2}}{A^{+d3} - A^{-d2}}\right)$ |
| $\dfrac{+d3 - (-d3)}{2}$ | $\dfrac{+d3 - (-d3)}{2}\left(\dfrac{A^{+d3} + A^{-d3}}{A^{+d3} - A^{-d3}}\right)$ |

Thus, from the one image, a plurality of combination of design offset and corresponding measured overlay are obtained. The plurality of combination of design offset and corresponding overlay obtained are provided (step S414) for post-processing, such as interpretation. Then the overlay measurement is complete (step S416).

Figure 5:
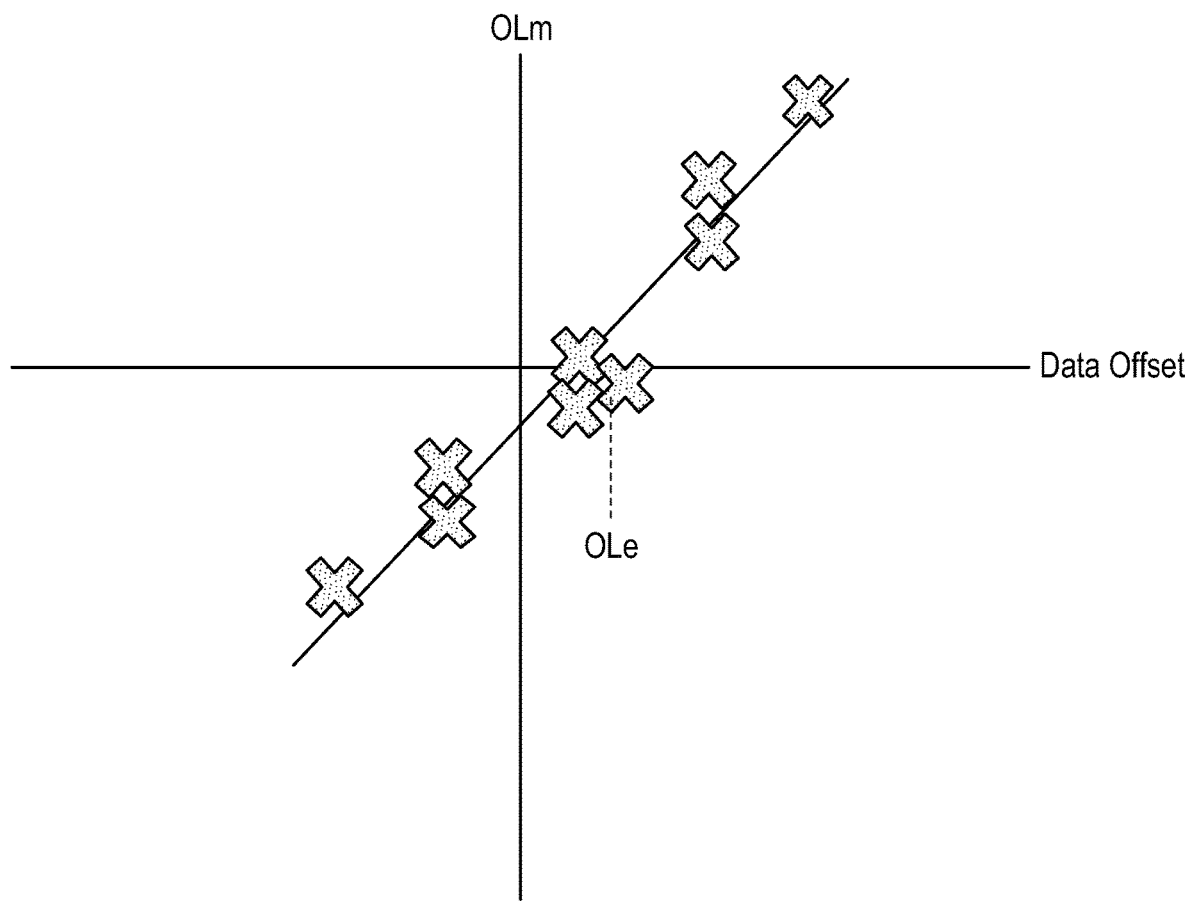
FIG. 5 is a diagram showing a correlation plot of a plurality of combinations of design offset and corresponding measured overlay in accordance with an embodiment of the present disclosure.

In some embodiments, the plurality of combinations of design offset and corresponding measured overlay may be plotted into a correlation diagram. FIG. 5 is a diagram showing a correlation plot of a plurality of combinations of design offset and corresponding measured overlay, in accordance with an embodiment of the present disclosure. In some embodiments, the correlation plot may be a linear fitting plot. In some embodiments, an estimated overlay OLe is computed as an x-intercept of a slope obtained by plotting the plurality of combinations of design offset as an x-value and corresponding measured overlay as a y-value in an equation (4) below.

$$OLe = x\text{-intercept(Design Offset, Measured Overlay)} \quad (4)$$

When the number of the plurality of combinations of design offset and corresponding measured overlay is small, errors due to noise may not be corrected. On the other hand, when the number of the plurality of combinations of design offset and corresponding measured overlay is increased, such as three or more positive offsets and three or more negative offsets, nine or more plots are obtained and linear fitting of these plots may be performed with higher accuracy with improved robustness to noise. As a result, more accurate estimation of overlays can be obtained.

Overlay measurement using a pair of alignment patterns including a plurality of positive offsets and a plurality of negative offsets which can be captured in one image increases a number of measured overlays to be obtained. As a result, greater accuracy and robustness can be achieved without increasing a number of samplings, such as capturing a plurality of images or providing a plurality of separate alignment pattern regions.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a first layer, including a first alignment pattern that comprises a first line extending in a first direction, the first line including first, second and third segments;
   a second layer above the first layer, including a second alignment pattern that comprises:
      a second line extending in the first direction above the first segment and having a first offset from the first segment in a second direction perpendicular to the first direction;
      a third line extending in the first direction above the second segment and having a second offset from the second segment in the second direction; and
      a fourth line extending in the first direction above the third segment and having a third offset from the third segment in the second direction,
   wherein the third offset is greater than the second offset and the second offset is greater than the first offset.

2. The apparatus of claim 1, wherein the first and second alignment patterns comprise a first site and a second site diagonal to each other, the first site including the first, second, third and fourth lines,
   wherein the second site comprises:
      a fifth line extending in the first direction, including fourth, fifth and sixth segments in the first alignment pattern,
      a sixth line in the second alignment pattern, extending in the first direction above the fourth segment and having the first offset from the fourth segment in a fourth direction opposite to the second direction;
      a seventh line in the second alignment pattern, extending in the first direction above the fifth segment and having the second offset from the fifth segment in the fourth direction,
      an eighth line in the second alignment pattern, extending in the first direction above the sixth and having the third offset from the sixth segment in the fourth direction.

3. The apparatus of claim 1, wherein the second layer comprises one or more bit lines.

4. The apparatus of claim 1, further comprising a substrate,
   wherein the first layer is above the substrate.

5. The apparatus of claim 1, further comprising a substrate,
   wherein the first layer is an upper portion of the substrate.

6. The apparatus of claim 5, wherein the first layer further comprises one or more bit line contacts.

7. The apparatus of claim 1, wherein a combination of the first segment and the second line is configured to provide first diffracted light having a first intensity towards the second direction responsive to being illuminated by a light from a third direction perpendicular to the first and second directions,
   wherein a combination of the second segment and the third line is configured to provide second diffracted light having a second intensity different from the first intensity towards the second direction responsive to being illuminated by the light from the third direction, and
   wherein a combination of the third segment and the fourth line is configured to provide third diffracted light having a third intensity different from the first and second intensities towards the second direction responsive to being illuminated by the light from the third direction.

8. The apparatus of claim 7, wherein the second alignment pattern is configured to transmit at least a portion of the light from the third direction.

9. The apparatus of claim 8, wherein the second alignment pattern comprises resin.

10. A method comprising:
    forming a first layer;
    forming a first alignment pattern including a first line extending in a first direction in the first layer, the first line including a first segment, a second segment and a third segment;
    forming a second layer above the first layer; and
    forming a second alignment pattern in the second layer including:
       forming a second line, a third line and a fourth line extending in the first direction above the first segment, the second segment and the third segment respectively, wherein the second line has a first offset from the first segment in a second direction perpendicular to the first direction,
wherein the third line has a second offset from the second segment in the second direction,
wherein the fourth line has a third offset from the second segment in the second direction, and
wherein the third offset is greater than the second offset and the second offset is greater than the first offset.

11. The method of claim 10, wherein;
forming the second alignment pattern comprises removing a portion of the second layer adjacent to the second line and a portion of the second layer adjacent to the third line.

12. The method of claim 10, wherein forming the second layer comprises depositing resin.

13. The method of claim 10, further comprising:
analyzing an overlay of the second alignment pattern over the first alignment pattern, including:
illuminating the first alignment pattern and the second alignment pattern with a light from a third direction perpendicular to the first and second directions;
collecting measurement data of diffracted light from the first and second alignment patterns; and
calculating an overlay of the second alignment pattern over the first alignment pattern from the measurement data.

14. The method of claim 10, further comprising:
responsive to the light illuminating the first and second alignment patterns:
providing first diffracted light having a first intensity towards the second direction by a combination of the first segment and the second line;
providing second diffracted light having a second intensity towards the second direction by a combination of the second segment and the third line; and
providing third diffracted light having a third intensity towards the second direction by a combination of the third segment and the fourth line,
wherein the first, second and third intensities are different from one another.

15. The method of claim 10, wherein forming the first alignment pattern comprises removing a portion of the first layer adjacent to the first line.

16. The method of claim 15, wherein forming the first alignment pattern comprises removing an upper portion of a substrate.

17. A method comprising:
illuminating a first alignment pattern and a second alignment pattern above the first pattern with a light from above the first and second alignment patterns;
capturing an image based on diffracted light from the first and second alignment patterns by a camera;
generating asymmetry maps of the first and second alignment patterns based on the image; and
calculating an overlay of the second alignment pattern over the first alignment pattern based on the asymmetry maps,
wherein the first alignment pattern comprises a first line extending in a first direction, including first, second and third segments,
wherein the second alignment pattern comprises:
a second line extending in the first direction above the first segment and having a first offset from the first segment in a second direction perpendicular to the first direction;
a third line extending in the first direction above the second segment and having a second offset from the second segment in the second direction; and
a fourth line extending in the first direction above the third segment and having a third offset from the third segment in the second direction, and
wherein the third offseet is greater than the second offset and the second offset is greater than the first offset.

18. The method of claim 17, wherein generating asymmetry maps of sites of the first and second alignment patterns based on the image comprises collecting measurement data of the diffracted light from the first and second alignment patterns.

19. The method of claim 18, wherein collecting measurement data of diffracted light from the first and second alignment patterns comprises:
obtaining a first pair of intensities of first diffracted light from the first segment and the second line;
obtaining a second pair of intensities of second diffracted light from the second segment and the third line; and
obtaining a third pair of intensities of third diffracted light from the third segment and the fourth line, and
wherein generating asymmetry maps comprises:
calculating a first asymmetry based on the first pair of intensities;
calculating a second asymmetry based on the second pair of intensities; and
calculating a third asymmetry based on the third pair of intensities.

20. The method of claim 19, wherein the first and second alignment patterns comprise a first site and a second site diagonal to each other, the first site including the first, second, third and fourth lines,
wherein the second site comprises:
a fifth line extending in the first direction, including fourth, fifth and sixth segments in the first alignment pattern,
a sixth line in the second alignment pattern, extending in the first direction above the fourth segment and having the first offset from the fourth segment in a fourth direction opposite to the second direction;
a seventh line in the second alignment pattern, extending in the first direction above the fifth segment and having the second offset from the fifth segment in the fourth direction; and
an eighth line in the second alignment pattern, extending in the first direction above the sixth segment and having the third offset from the sixth segment in the fourth direction,
wherein collecting measurement data of diffracted light from the first and second alignment patterns further comprises:
obtaining a fourth pair of intensities of fourth diffracted light from the fourth segment and the sixth line;
obtaining a fifth pair of intensities of fifth diffracted light from the fifth segment and the seventh line; and
obtaining a sixth pair of intensities of sixth diffracted light from the sixth segment and the eighth line, and
wherein generating asymmetry maps further comprises:
calculating a fourth asymmetry based on the fourth pair of intensities;
calculating a fifth asymmetry based on the fifth pair of intensities; and
calculating a sixth asymmetry based on the sixth pair of intensities.

21. The method of claim 20, wherein calculating an estimated overlay of the second alignment pattern over the first alignment pattern based on the asymmetry maps includes:
    calculating a plurality of overlays based on combinations of one asymmetry among the first, second and third asymmetries and one asymmetry among the fourth, fifth and sixth asymmetries;
    plotting the plurality of overlays; and
    computing the estimated overlay as an intercept of a slope based on the plotted plurality of overlays.

\* \* \* \* \*